US010665271B2

(12) United States Patent
Takeda et al.

(10) Patent No.: US 10,665,271 B2
(45) Date of Patent: May 26, 2020

(54) DRIVING CIRCUIT, SEMICONDUCTOR DEVICE INCLUDING THE SAME, AND CONTROL METHOD OF THE DRIVING CIRCUIT

(71) Applicant: RENESAS ELECTRONICS CORPORATION, Tokyo (JP)

(72) Inventors: Koichi Takeda, Tokyo (JP); Takashi Iwase, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/151,089

(22) Filed: Oct. 3, 2018

(65) Prior Publication Data
US 2019/0172503 A1   Jun. 6, 2019

(30) Foreign Application Priority Data
Dec. 1, 2017   (JP) .................................. 2017-231556

(51) Int. Cl.
*G11C 5/14* (2006.01)
*H03K 19/0185* (2006.01)
(Continued)

(52) U.S. Cl.
CPC .............. *G11C 5/14* (2013.01); *G11C 7/1093* (2013.01); *G11C 8/08* (2013.01); *G11C 8/14* (2013.01); *G11C 8/18* (2013.01); *H03K 19/0185* (2013.01); *H03K 19/018521* (2013.01); *G11C 8/10* (2013.01); *H03K 5/1534* (2013.01)

(58) Field of Classification Search
CPC .......... G11C 5/14; G11C 7/1093; G11C 8/08; G11C 8/14; G11C 8/18; H03K 19/0185
See application file for complete search history.

(56) References Cited

U.S. PATENT DOCUMENTS 6,240,039 B1 *  5/2001  Lee .......................... G11C 8/10
                                                365/189.05
7,872,907 B2 *  1/2011  Okayama ............... G11C 5/025
                                                365/158
(Continued)

FOREIGN PATENT DOCUMENTS

JP         11-163713 A       6/1999

OTHER PUBLICATIONS

Extended European Search Report issued in corresponding European Patent Application No. 18207003.7-1206, dated Jul. 15, 2019.

*Primary Examiner* — Mushfique Siddique
(74) *Attorney, Agent, or Firm* — McDermott Will & Emery LLP

(57) ABSTRACT

According to an embodiment, a word line driver includes: a first inverter that is driven by a first power supply voltage and inverts and outputs a decode signal; a second inverter that is driven by a second power supply voltage and inverts and outputs the decode signal; a first PMOS transistor that is controlled to be turned on or off on the basis of an output signal of the second inverter; a first NMOS transistor that is controlled to be turned on or off on the basis of an output signal of the first inverter; and a second PMOS transistor that is provided between a power supply voltage terminal to which the second power supply voltage is supplied and the gate of the first PMOS transistor and is temporarily turned on in synchronization with falling of the decode signal.

13 Claims, 14 Drawing Sheets

(51) Int. Cl.
    *G11C 7/10*     (2006.01)
    *G11C 8/08*     (2006.01)
    *G11C 8/14*     (2006.01)
    *G11C 8/18*     (2006.01)
    *H03K 5/1534*     (2006.01)
    *G11C 8/10*     (2006.01)

(56) References Cited

U.S. PATENT DOCUMENTS

| | | | |
|---|---|---|---|
| 2005/0237848 A1* | 10/2005 | Takahashi | G11C 5/145 |
| | | | 365/232 |
| 2007/0008804 A1* | 1/2007 | Lu | G11C 8/08 |
| | | | 365/230.03 |
| 2008/0144402 A1* | 6/2008 | Hirabayashi | G11C 8/08 |
| | | | 365/189.11 |
| 2009/0002052 A1* | 1/2009 | Kiritani | H03K 3/356113 |
| | | | 327/333 |
| 2009/0243705 A1 | 10/2009 | Huang et al. | |
| 2010/0202241 A1* | 8/2010 | Park | G11C 8/08 |
| | | | 365/230.06 |
| 2011/0292754 A1* | 12/2011 | Chan | G11C 16/30 |
| | | | 365/230.06 |
| 2017/0169874 A1* | 6/2017 | Dray | G11C 8/08 |
| 2018/0122436 A1* | 5/2018 | Son | G11C 5/148 |

* cited by examiner

DRIVING CIRCUIT, SEMICONDUCTOR DEVICE INCLUDING THE SAME, AND CONTROL METHOD OF THE DRIVING CIRCUIT

CROSS-REFERENCE TO RELATED APPLICATIONS

The disclosure of Japanese Patent Application No. 2017-231556 filed on Dec. 1, 2017 including the specification, drawings and abstract is incorporated herein by reference in its entirety.

BACKGROUND

The present invention relates to a driving circuit, a semiconductor device including the same, and a control method of the driving circuit, and relates to, for example, a driving circuit, a semiconductor device including the same, and a control method of the driving circuit suitable for improving the reliability without increasing the power consumption.

In general, a word line driver for driving a word line of a memory cell array is configured using a CMOS gate that is excellent in a high-speed operation and low power consumption.

Here, in the case where a word line of a DRAM (Dynamic Random Access Memory), a non-volatile memory, or the like is driven, a word line driver needs to apply a voltage as high as possible to the word line in order to accurately read data stored in a memory cell. Accordingly, in the case where the word line of the DRAM, the non-volatile memory, or the like is driven, the word line driver applies a high voltage to the word line by being driven by a power supply voltage higher than a rated voltage.

However, in the word line driver configured using the CMOS gate, a high voltage is steadily applied to a plurality of specific MOS transistors, and thus these MOS transistors possibly suffer dielectric breakdown. Accordingly, there has been a problem that the reliability of a semiconductor device in which the word line driver is mounted is deteriorated.

A solution to such a problem is disclosed in Japanese Unexamined Patent Application Publication No. Hei 11 (1999)-163713. A driver disclosed in Japanese Unexamined Patent Application Publication No. Hei 11 (1999)-163713 includes an output-stage inverter, a first inverter that is driven by a high voltage VDH to output the inverted signal of an input signal Vin to the gate of a PMOS transistor provided in the output-stage inverter, and a second inverter that is driven by a low voltage VDL (<high voltage VDH) to output the inverted signal of the input signal Vin to the gate of an NMOS transistor provided in the output-stage inverter.

Here, since the second inverter is driven by the low voltage VDL, a high voltage is not steadily applied to each MOS transistor configuring the second inverter. Therefore, the possibility that each MOS transistor configuring the second inverter suffers dielectric breakdown is low. Accordingly, the reliability of the driver disclosed in Japanese Unexamined Patent Application Publication No. Hei 11 (1999)-163713 can be improved because the number of MOS transistors suffering dielectric breakdown can be reduced.

SUMMARY

In the driver disclosed in Japanese Unexamined Patent Application Publication No. Hei 11 (1999)-163713, however, the driving voltage (high voltage VDH) for the first inverter is different from the driving voltage (low voltage VDL) for the second inverter. Thus, a period of time required for an output signal of the first inverter to rise is different from that required for an output signal of the second inverter to rise. Accordingly, the PMOS transistor and the NMOS transistor configuring the output-stage inverter are unintentionally turned on at the same time. Thus, there has been a problem that a through-current is increased, resulting in an increase in power consumption.

The other problems and novel features will become apparent from the description of the specification and the accompanying drawings.

According to an embodiment, a driving circuit includes: a first inverter that is driven by a first power supply voltage and inverts and outputs a first input signal; a second inverter that is driven by a second power supply voltage higher than the first power supply voltage and inverts and outputs the first input signal; a first PMOS transistor that controls a current flowing to an external output terminal from a power supply voltage terminal to which the second power supply voltage is supplied on the basis of an output signal of the second inverter; a first NMOS transistor that controls a current flowing to a reference voltage terminal from the external output terminal on the basis of an output signal of the first inverter; and a second PMOS transistor that is provided between the power supply voltage terminal to which the second power supply voltage is supplied and the gate of the first PMOS transistor and is temporarily turned on in synchronization with falling of the first input signal.

According to another embodiment, a control method of a driving circuit includes the steps of: inverting and outputting a first input signal using a first inverter driven by a first power supply voltage; inverting and outputting the first input signal using a second inverter that is driven by a second power supply voltage higher than the first power supply voltage; controlling a current flowing in a first PMOS transistor provided between a power supply voltage terminal to which the second power supply voltage is supplied and an external output terminal on the basis of an output signal of the second inverter; controlling a current flowing in a first NMOS transistor provided between the external output terminal and a reference voltage terminal on the basis of an output signal of the first inverter; and turning temporarily on a second PMOS transistor that is provided between the power supply voltage terminal to which the second power supply voltage is supplied and the gate of the first PMOS transistor in synchronization with falling of the first input signal.

According to the above-described embodiments, it is possible to provide a driving circuit, a semiconductor device including the same, and a control method of the driving circuit capable of improving the reliability without increasing the power consumption.

DETAILED DESCRIPTION

Figure 1:
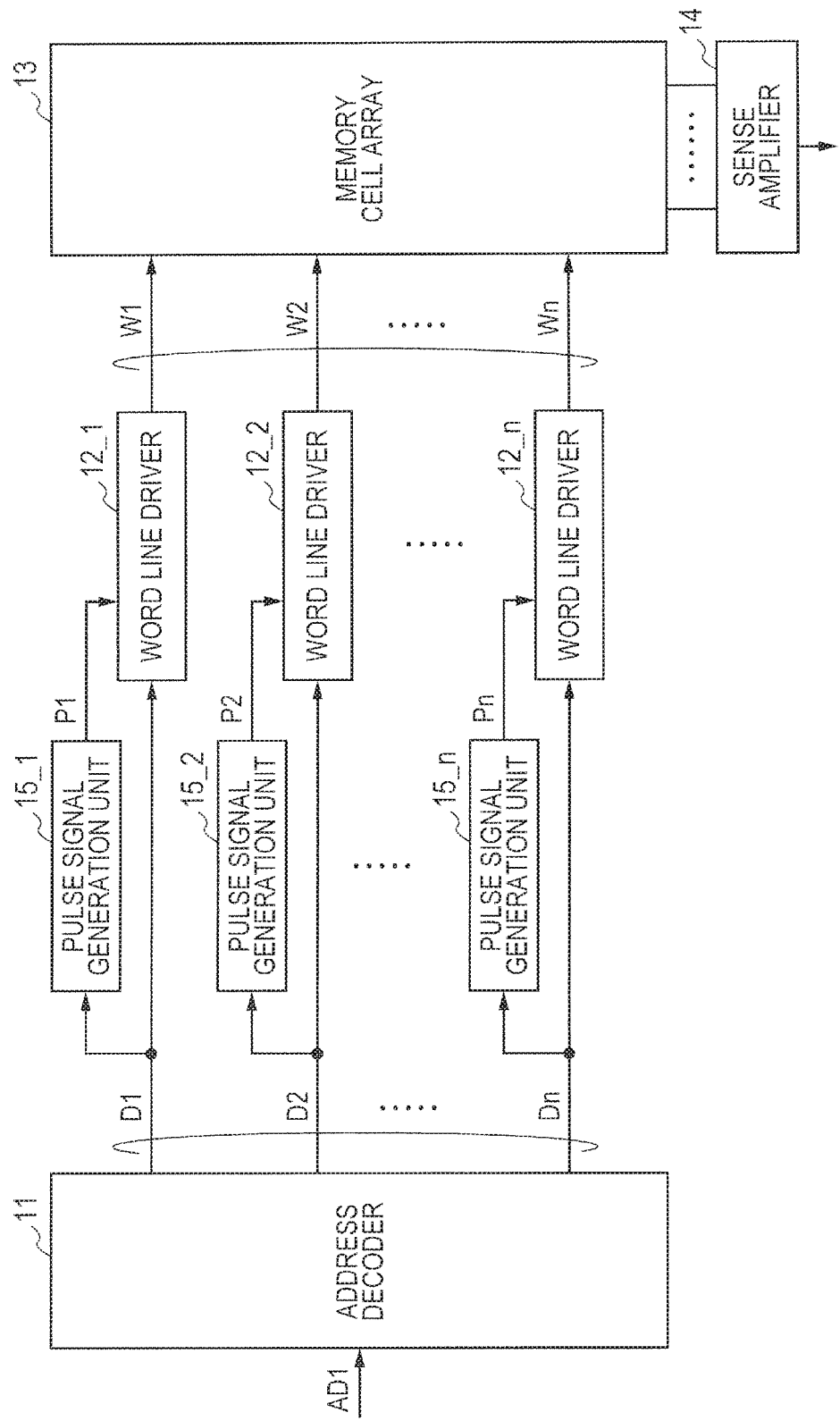
FIG. 1 is a block diagram for showing a configuration example of a semiconductor device according to a first embodiment.

In order to clarify the explanation, the following description and drawings are appropriately omitted and simplified. In addition, each element illustrated in the drawings as a functional block for performing various processes can be configured using a CPU, a memory, or other circuits as hardware, and can be realized by a program or the like loaded to a memory as software. Thus, a person skilled in the art can understand that these functional blocks can be realized in various forms such as only hardware, only software, or a combination thereof, and are not limited to any one of these. It should be noted that the same elements are followed by the same signs in each drawing, and the duplicated explanation thereof is appropriately omitted.

Further, the above-described program can be stored and supplied to a computer using various types of non-transitory computer readable media. The non-transitory computer readable media include various types of tangible recording media. Examples of the non-transitory computer readable media include a magnetic recording medium (for example, a flexible disk, a magnetic tape, or a hard disk drive), a magneto-optical recording medium (for example, a magneto-optical disk), a CD-ROM (Read Only Memory), a CD-R, a CD-R/W, and a semiconductor memory (for example, a mask ROM, a PROM (Programmable ROM), an EPROM (Erasable PROM), a flash ROM, or a RAM (Random Access Memory)). Further, the program may be supplied to a computer by various types of transitory computer readable media. Examples of the transitory computer readable media include an electrical signal, an optical signal, and an electromagnetic wave. The program can be supplied to a computer by the transitory computer readable media via a wired communication path such as a wire or an optical fiber, or a wireless communication path.

<Previous Consideration by Inventors>

Before describing the details of a semiconductor device according to a first embodiment, a semiconductor device previously considered by the inventors will be described.

Figure 12:
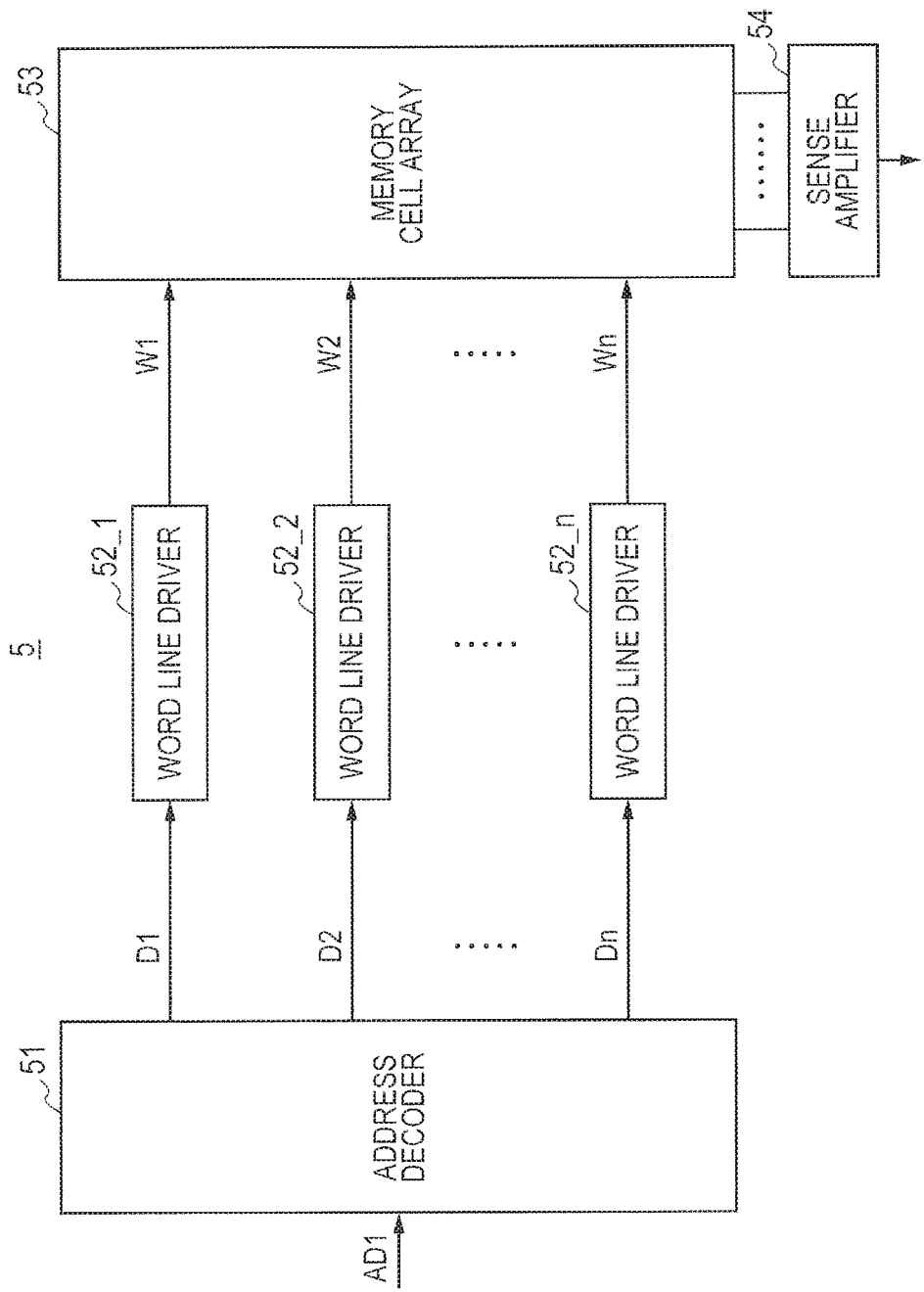
FIG. 12 is a block diagram for showing a configuration example of a semiconductor device according to an idea before leading to the embodiment.

FIG. 12 is a block diagram for showing a configuration example of a semiconductor device 5 according to an idea before leading to the embodiment. The semiconductor device 5 is, for example, a DRAM, a non-volatile memory, or the like, and reads and outputs data stored in a memory cell at an address designated by an address signal among those configuring a memory cell array.

Specifically, the semiconductor device 5 includes, at least, an address decoder 51, n (n is a natural number) word line drivers 52 provided in association with word lines WL1 to WLn in n rows, a memory cell array 53, and a sense amplifier 54. It should be noted that the n word line drivers 52 are also referred to as word line drivers 52_1 to 52_$n$ in the following description.

The address decoder 51 decodes an address signal AD1 to generate n decode signals D1 to Dn. The word line drivers 52_1 to 52_$n$ drive the decode signals D1 to Dn, and output the same to the word lines WL1 to WLn, respectively. Hereinafter, signals output to the word lines WL1 to WLn are referred to as word line signals W1 to Wn.

The memory cell array 53 is configured using a plurality of memory cells arranged in a matrix manner having, for example, n rows and m columns (n and m are natural numbers). When reading data, the word line designated by the address signal AD1 among the n word lines WL1 to WLn is activated (namely, indicating the H level). Further, all other word lines are inactivated (namely, indicating the L level). Accordingly, pieces of data stored in the memory cells in m columns provided in association with the activated word lines propagate through m bit lines.

The sense amplifier 54 amplifies the data propagating through the bit line designated (selected) by the address signal AD1 among those propagating through the m bit lines, and outputs the amplified data as read data.

(Concrete Configuration Example of Word Line Driver 52)

Figure 13:
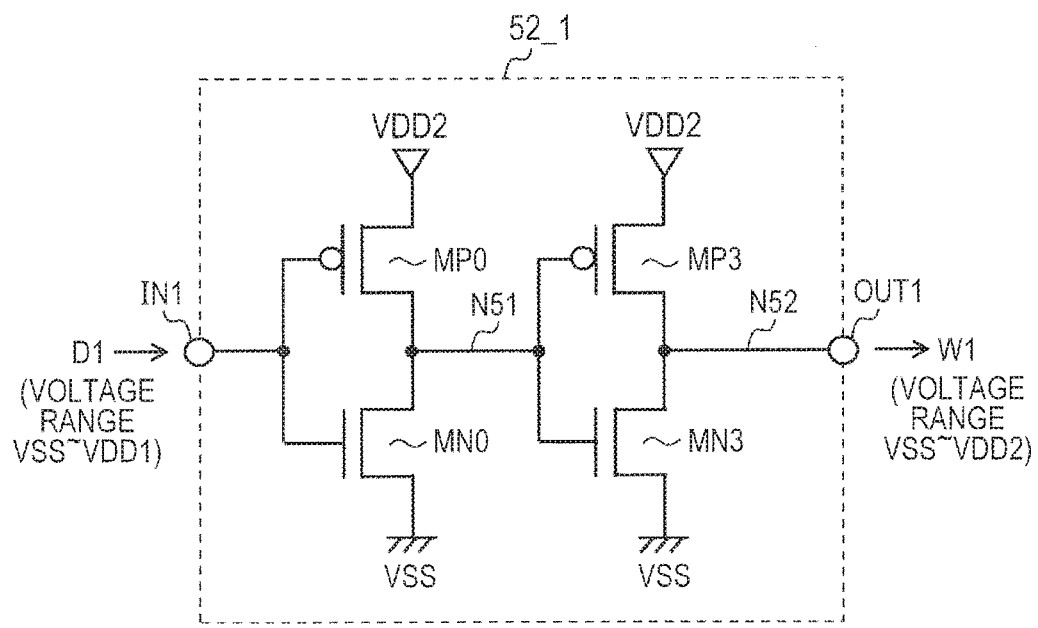
FIG. 13 is a circuit diagram for showing a concrete configuration example of a word line driver provided in the semiconductor device shown in FIG. 12.

FIG. 13 is a circuit diagram for showing a concrete configuration example of the word line driver 52. FIG. 13 exemplifies a case in which the word line driver 52 is the word line driver 52_1 in the first row. However, the same applies to cases of the word line drivers 52_2 to 52_$n$.

As shown in FIG. 13, the word line driver 52_1 is configured using a CMOS gate that is excellent in a high-speed operation and low power consumption. Here, in order to accurately read data stored in memory cells of a DRAM, a non-volatile memory, or the like, it is necessary to apply a higher voltage to the word lines. Therefore, since the word line driver 52_1 is driven by a power supply voltage VDD2 higher than a power supply voltage VDD1 that is a rated voltage, the word line driver 52_1 applies a high voltage to the word line WL1.

Specifically, the word line driver 52_1 includes PMOS transistors MP0 and MP3 and NMOS transistors MN0 and MN3. An inverter of the preceding stage is configured using the transistors MP0 and MN0. An inverter of the subsequent stage is configured using the transistors MP3 and MN3.

In the transistor MP0, the source is coupled to a power supply voltage terminal (hereinafter, referred to as a power supply voltage terminal VDD2) to which the power supply voltage VDD2 is supplied, the drain is coupled to a node N51, and the gate is coupled to an input terminal IN1 to which a decode signal D1 indicating a voltage range between the reference voltage VSS and the power supply voltage VDD1 is supplied.

In the transistor MN0, the source is coupled to a reference voltage terminal (hereinafter, referred to as a reference voltage terminal VSS) to which the reference voltage VSS is supplied, the drain is coupled to the node N51, and the gate is coupled to the input terminal IN1.

In the transistor MP3, the source is coupled to the power supply voltage VDD2, the drain is coupled to an output terminal OUT1, and the voltage (namely, the output of the inverter of the preceding stage) of the node N51 is applied to the gate. In the transistor MN3, the source is coupled to the reference voltage VSS, the drain is coupled to the output terminal OUT1, and the voltage (namely, the output of the inverter of the preceding stage) of the node N51 is applied to the gate. In addition, the voltage of the output terminal OUT1 is output as a word line signal W1.

As described above, the word line driver 52_1 is driven by the power supply voltage VDD2 higher than the power supply voltage VDD1. Accordingly, in the case where the word line driver 52_1 activates the word line signal W1 in response to the activation of the decode signal D1, the word line driver 52_1 can apply the power supply voltage VDD2 higher than the power supply voltage VDD1 to the word line WL1 as the word line signal W1.

(Operation of Word Line Driver 52)

Figure 14:
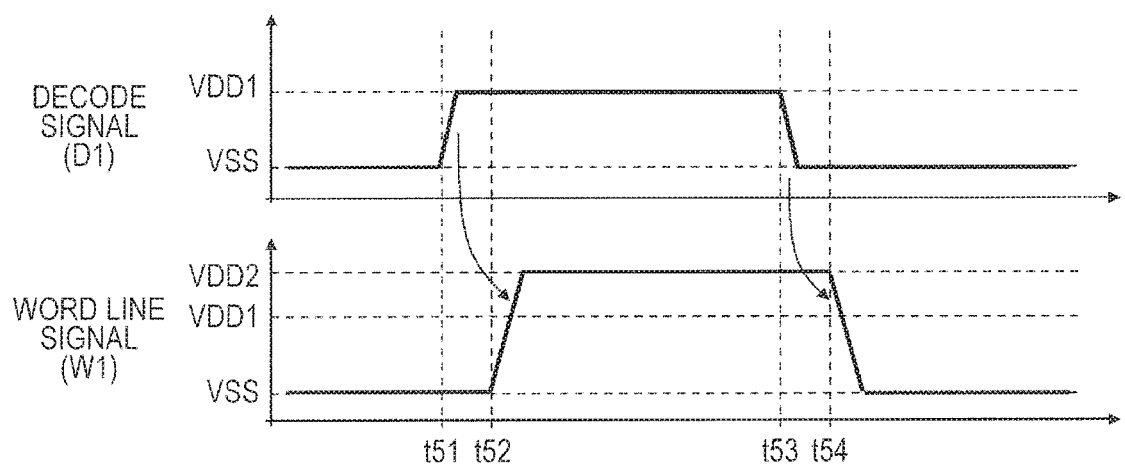
FIG. 14 is a timing chart for showing an operation of the word line driver shown in FIG. 13.

FIG. 14 is a timing chart for showing an operation of the word line driver 52. FIG. 14 exemplifies a case in which the word line driver 52 is the word line driver 52_1 in the first row. However, the same applies to cases of the word line drivers 52_2 to 52_n.

In the case where a data reading operation is performed, one of n decode signals D1 to Dn output from the address decoder 51 rises. In the example of FIG. 14, the decode signal D1 rises (time t51). Accordingly, the word line signal W1 is activated. That is, the word line signal W1 rises (time t52). When the data reading operation is completed, the decode signal D1 falls (time t53). Accordingly, the word line signal W1 is inactivated. That is, the word line signal W1 falls (time t54). It should be noted that the transistor MP0 is not completely turned off during the period (time t51 to t53) when the decode signal D1 is being activated because a potential difference between the gate and the source corresponds to a difference between VDD2 and VDD1. Therefore, some through-current flows into the transistors MP0 and MN0. However, if the power supply voltage VDD2 is equal to or smaller than a voltage value obtained by adding the threshold voltage (absolute value) of the PMOS transistor to the power supply voltage VDD1, the through-current becomes small. Further, the through-current is limited during the period when the decode signal D1 is being activated. Thus, it is assumed that the through-current is negligibly small in the embodiment.

Here, the word line driver 52 is required to have high reliability as well as a high-speed operation and low power consumption. Hereinafter, factors affecting each of the high-speed operation, the low power consumption, and the high reliability will be concretely described.

First, there are two factors affecting the high-speed operation: a delay caused by the selected word line driver activating the word line and a delay caused by the selected word line driver inactivating the word line. The former affects access time (time required from transmitting an access signal such as an address signal or a clock signal to reading stored data) to the memory cell array and an access cycle (time required from transmitting a certain access signal to transmitting the next access signal, and the latter affects an access cycle to the memory cell array.

Next, there are two main factors affecting the low power consumption: a current charged to or discharged from the load capacity of the word line by the selected word line driver and a through-current generated in the selected word line driver.

Further, TDDB (Time dependent dielectric breakdown) is a factor affecting the high reliability. The TDDB is a phenomenon of dielectric breakdown of a transistor provided in the non-selected word line driver caused by steadily applying a high voltage to the transistor. The TDDB is likely to occur due to a rise in the applied voltage and an increase in the size of the transistor to which a high voltage is applied.

Here, in the transistors MP0 and MN3 of each word line driver 52 provided on the non-selected word line, the high power supply voltage VDD2 is steadily applied between the gate and the source of each transistor, and thus there is a high possibility that the TDDB occurs. As a result, there has been a problem that the reliability of the semiconductor device 5 is deteriorated. The problem becomes remarkable as the value of the power supply voltage VDD2 is increased in order to increase a memory cell current or to enhance the driving capability of the word line driver 52.

It should be noted that if the sizes of the transistors MP0 and MN3 are reduced, the occurrence of the TDDB is suppressed. However, the delay time required to inactivate the word line in the active state is increased, and thus a data reading cycle becomes long.

In order to solve such problems, the inventors considered a word line driver 62 next.

(Concrete Configuration Example of Word Line Driver 62)

Figure 15:
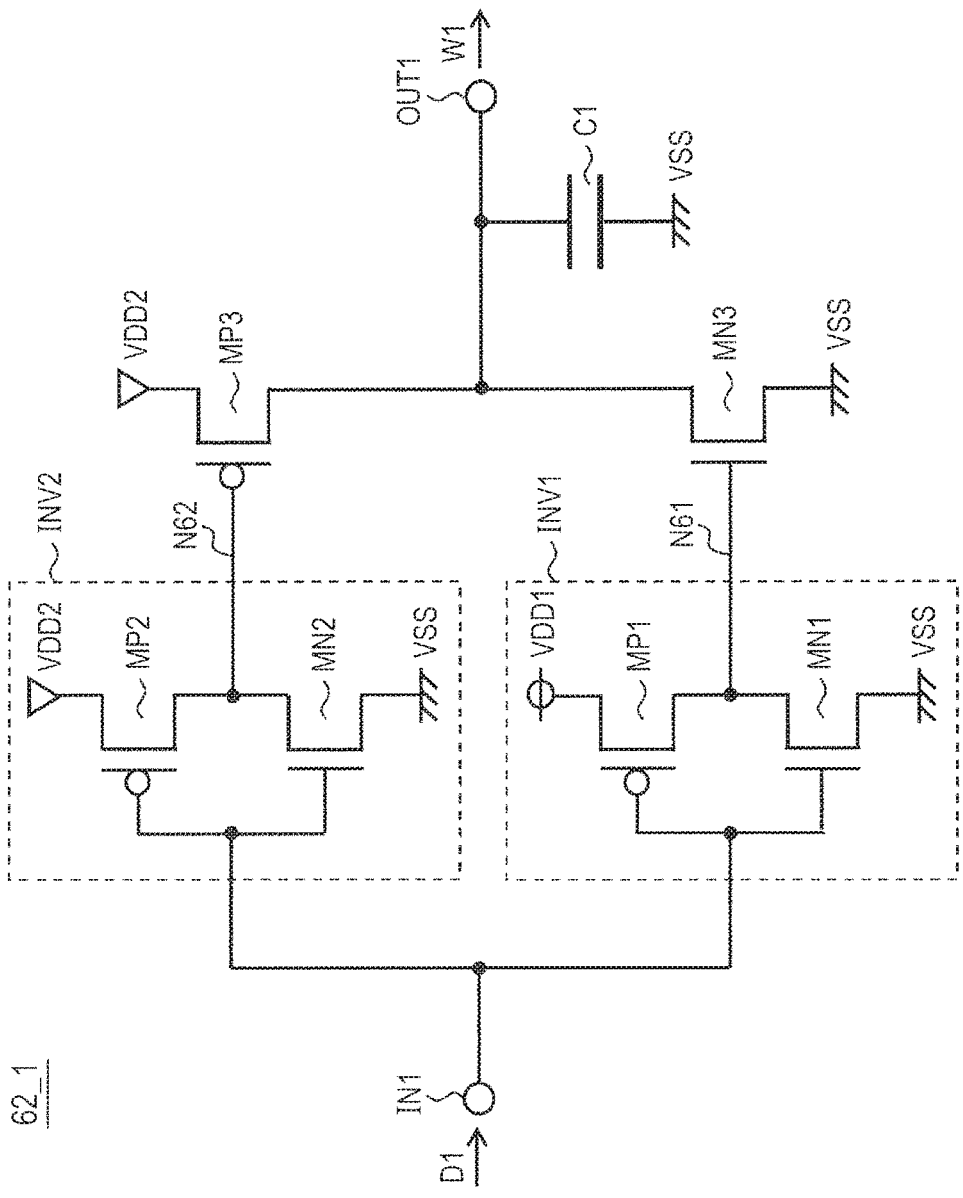
FIG. 15 is a circuit diagram for showing a concrete configuration example of a word line driver provided in a semiconductor device according to an idea before leading to the embodiment.

FIG. 15 is a circuit diagram for showing a concrete configuration example of the word line driver 62 provided in a semiconductor device 6 according to an idea before leading to the embodiment. FIG. 15 exemplifies a case in which the word line driver 62 is a word line driver 62_1 in the first row. However, the same applies to cases of word line drivers 62_2 to 62_n.

As shown in FIG. 15, the word line driver 62_1 includes PMOS transistors MP1 to MP3 and NMOS transistors MN1 to MN3. An inverter INV1 is configured using the transistors MP1 and MN1. An inverter INV2 is configured using the transistors MP2 and MN2.

In the transistor MP1 configuring the inverter INV1, the source is coupled to a power supply voltage terminal (hereinafter, referred to as a power supply voltage terminal VDD1) to which the power supply voltage VDD1 is supplied, the drain is coupled to a node N61, and the gate is coupled to the input terminal IN1 to which the decode signal D1 is supplied. In the transistor MN1, the source is coupled to the reference voltage terminal VSS, the drain is coupled to the node N61, and the gate is coupled to the input terminal IN1.

In the transistor MP2 configuring the inverter INV2, the source is coupled to the power supply voltage terminal VDD2, the drain is coupled to a node N62, and the gate is coupled to the input terminal IN1. In the transistor MN2, the source is coupled to the reference voltage terminal VSS, the drain is coupled to the node N62, and the gate is coupled to the input terminal IN1.

The transistor MP3 is a pull-up element, and controls a current flowing from the power supply voltage terminal VDD2 to the output terminal OUT1 on the basis of the output voltage of the inverter INV2. Specifically, in the transistor MP3, the source is coupled to the power supply voltage terminal VDD2, the drain is coupled to the output terminal OUT1, and the gate is coupled to the output of the inverter INV2.

The transistor MN3 is a pull-down element, and controls a current flowing from the output terminal OUT1 to the reference voltage terminal VSS on the basis of the output voltage of the inverter INV1. Specifically, in the transistor MN3, the source is coupled to the reference voltage terminal VSS, the drain is coupled to the output terminal OUT1, and the gate is coupled to the output of the inverter INV1.

Here, as described above, there is a possibility that the TDDB occurs in both of two transistors MP0 and MN3 in the word line driver 52. On the contrary, since the inverter INV1 is driven by the power supply voltage VDD1 in the word line driver 62, the power supply voltage VDD2 is steadily applied between the gate and the source of only the transistor MP2 in the non-selection state. That is, there is a possibility that the TDDB occurs only in the transistor MP2 in the word line driver 62, and the transistor MN3 is excluded. Therefore, the occurrence of the TDDB can be reduced in the word line driver 62 as compared to the case of the word line driver 52.

Further, the size of the gate of the transistor MN3 is generally more than three times the size of the gate of the transistor MP2. Thus, the probability of occurrence of the TDDB can be considerably reduced in the word line driver 62 by excluding the transistor MN3 from the target of the occurrence of the TDDB. As a result, the reliability of the semiconductor device 6 can be improved.

It should be noted that since the probability of occurrence of the TDDB is reduced, the driving capability of the word line driver 62 can be enhanced by setting the value of the power supply voltage VDD2 larger than that in the case of the word line driver 52.

However, since the driving voltage supplied to the inverter INV1 is different from that supplied to the inverter INV2 in the word line driver 62, a period of time required for the output signal of the inverter INV1 to rise is different from that required for the output signal of the inverter INV2 to rise. Accordingly, the transistor MP3 and the transistor MN3 provided on the output stage are unintentionally turned on at the same time. Thus, there has been a problem that the through-current is increased, resulting in an increase in power consumption.

(Operation of Word Line Driver 62)

Figure 16:
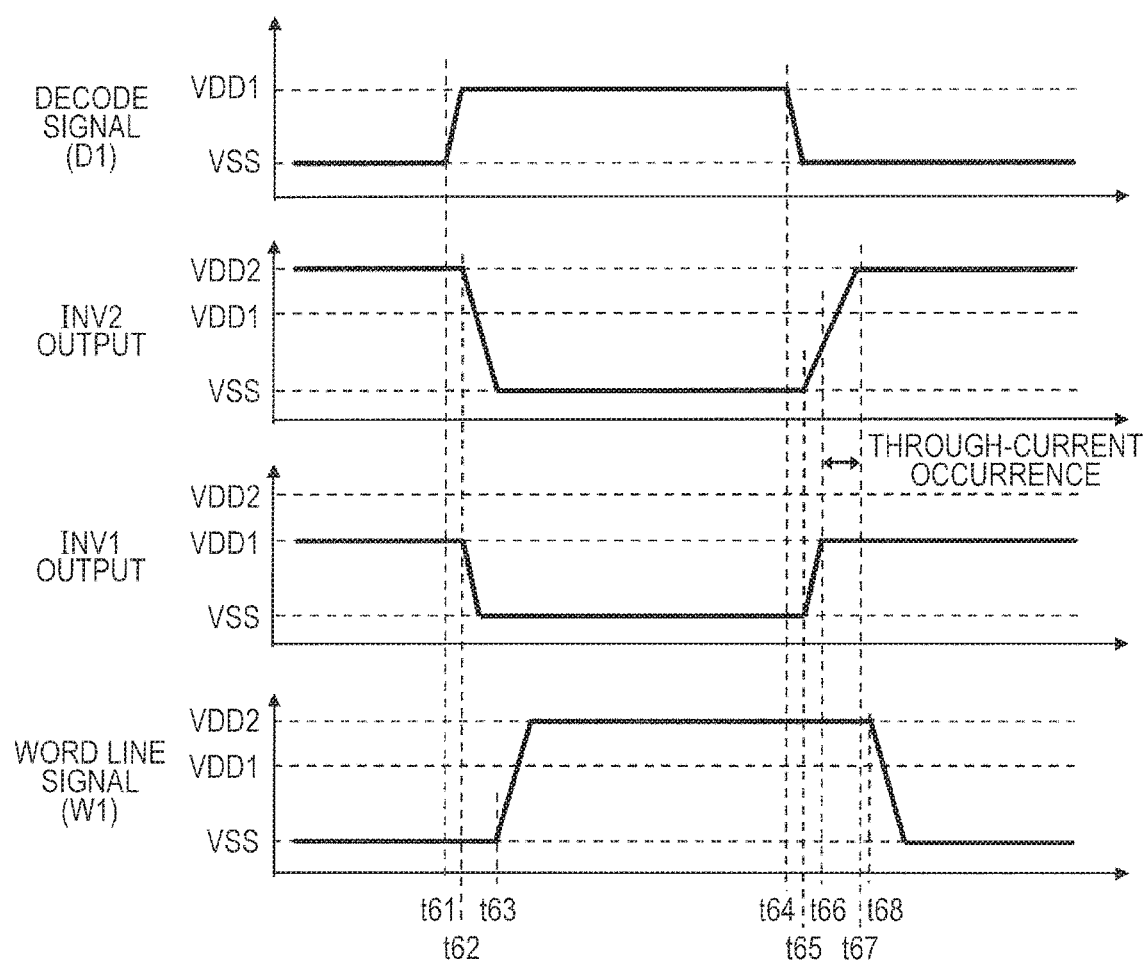
FIG. 16 is a timing chart for showing an operation of the word line driver shown in FIG. 15.

FIG. 16 is a timing chart for showing an operation of the word line driver 62. FIG. 16 exemplifies a case in which the word line driver 62 is the word line driver 62_1 in the first row. However, the same applies to cases of the word line drivers 62_2 to 62_n.

In a data reading operation, the decode signal D1 rises first (time t61). Accordingly, the output signal of each of the inverters INV1 and INV2 falls (time t62). Accordingly, the transistor MP3 is turned on, and the transistor MN3 is turned off. Thus, the word line signal W1 is activated. That is, the word line signal W1 rises (time t63).

Thereafter, when the data reading operation is completed, the decode signal D1 falls (time t64). Accordingly, the output signal of each of the inverters INV1 and INV2 starts to rise (time t65). When the output signal of each of the inverters INV1 and INV2 rises (time t66 and time t67), the transistor MP3 is turned off, and the transistor MN3 is turned on. Thus, the word line signal W1 is inactivated. That is, the word line signal W1 falls (time t68).

Here, the inverter INV1 is driven by the power supply voltage VDD1, and the inverter INV2 is driven by the power supply voltage VDD2 higher than the power supply voltage VDD1. Therefore, the time (time t67) when the output signal of the inverter INV2 rises to the level of the power supply voltage VDD2 is later than the time (time t66) when the output signal of the inverter INV1 rises to the level of the power supply voltage VDD1. Accordingly, the transistor MN3 is fully turned on before the transistor MP3 is turned off. Accordingly, since the transistors MP3 and MN3 are turned on at the same time in the period (time t66 to t67) from the time when the transistor MN3 is fully turned on after the output signal of the inverter INV1 rises to the level of the power supply voltage VDD1 to the time when the transistor MP3 is turned off after the output signal of the inverter INV2 rises to the level of the power supply voltage VDD2, the through-current is increased, resulting in an increase in power consumption.

It should be noted that if the size of the transistor MP2 is enlarged, the time (time t67) when the transistor MP3 is turned off can be advanced to around the time (time t66) when the transistor MN3 is fully turned on. Thus, the through-current is suppressed from being increased. However, if the size of the transistor MP2 is enlarged, the probability of occurrence of the TDDB in the transistor MP2 becomes high.

Alternatively, if the size of the transistor MP1 is reduced, the time (time t66) when the transistor MN3 is fully turned on can be delayed to around the time (time t67) when the transistor MP3 is turned off. Thus, the through-current is suppressed from being increased. However, if the size of the transistor MP1 is reduced, the operation speed of the word line driver 62 becomes slower.

As a result, the inventors found a semiconductor device 1 according to a first embodiment that can improve the reliability while suppressing the power consumption from being increased.

First Embodiment

FIG. 1 is a block diagram for showing a configuration example of a semiconductor device 1 according to a first embodiment. The semiconductor device 1 is, for example, a DRAM, a non-volatile memory, or the like, and reads and outputs data stored in a memory cell at an address designated by an address signal among those configuring a memory cell array.

Specifically, the semiconductor device 1 includes, at least, an address decoder 11, n (n is a natural number) word line drivers 12, a memory cell array 13, a sense amplifier 14, and n pulse signal generation units 15. The n word line drivers 12 and the n pulse signal generation units 15 are provided in association with word lines WL1 to WLn in n rows. In the following description, the n word line drivers 12 are also referred to as word line drivers 12_1 to 12_n. Further, the n pulse signal generation units 15 are also referred to as pulse signal generation unit 15_1 to 15_n.

The address decoder 11 decodes an address signal AD1 to generate n decode signals D1 to Dn.

The pulse signal generation units 15_1 to 15_n generate pulse signals P1 to Pn that temporarily fall in association with falling of the decode signals D1 to Dn, respectively. These pulse signals P1 to Pn are supplied to the word line drivers 12_1 to 12_n, respectively.

(Concrete Configuration of Pulse Signal Generation Unit 15)

Figure 2:
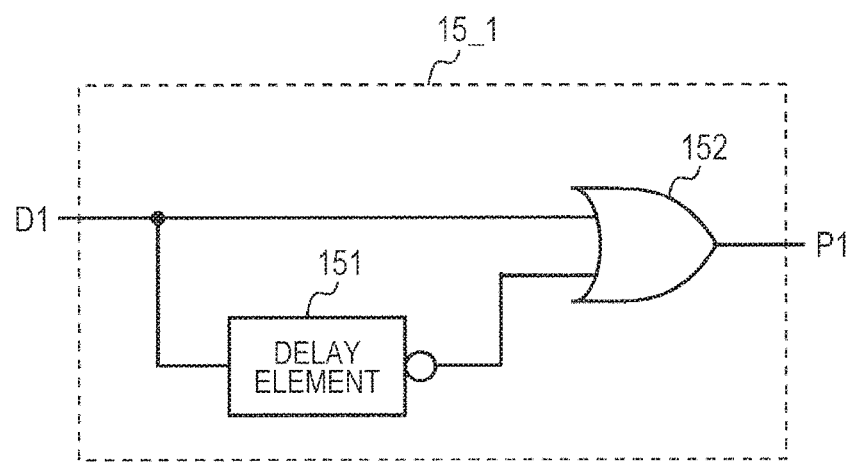
FIG. 2 is a circuit diagram for showing a concrete configuration example of a pulse signal generation unit shown in FIG. 1.

FIG. 2 is a circuit diagram for showing a concrete configuration example of the pulse signal generation unit 15. FIG. 2 exemplifies a case in which the pulse signal generation unit 15 is the pulse signal generation unit 15_1 in the first row. However, the same applies to cases of the pulse signal generation units 15_2 to 15_n.

As shown in FIG. 2, the pulse signal generation unit 15_1 includes a delay element 151 and an OR circuit 152. The delay element 151 outputs an inverted signal of the decode signal D1. The OR circuit 152 outputs a logical sum of the decode signal D1 and the output signal of the delay element 151 as the pulse signal P1.

Figure 3:
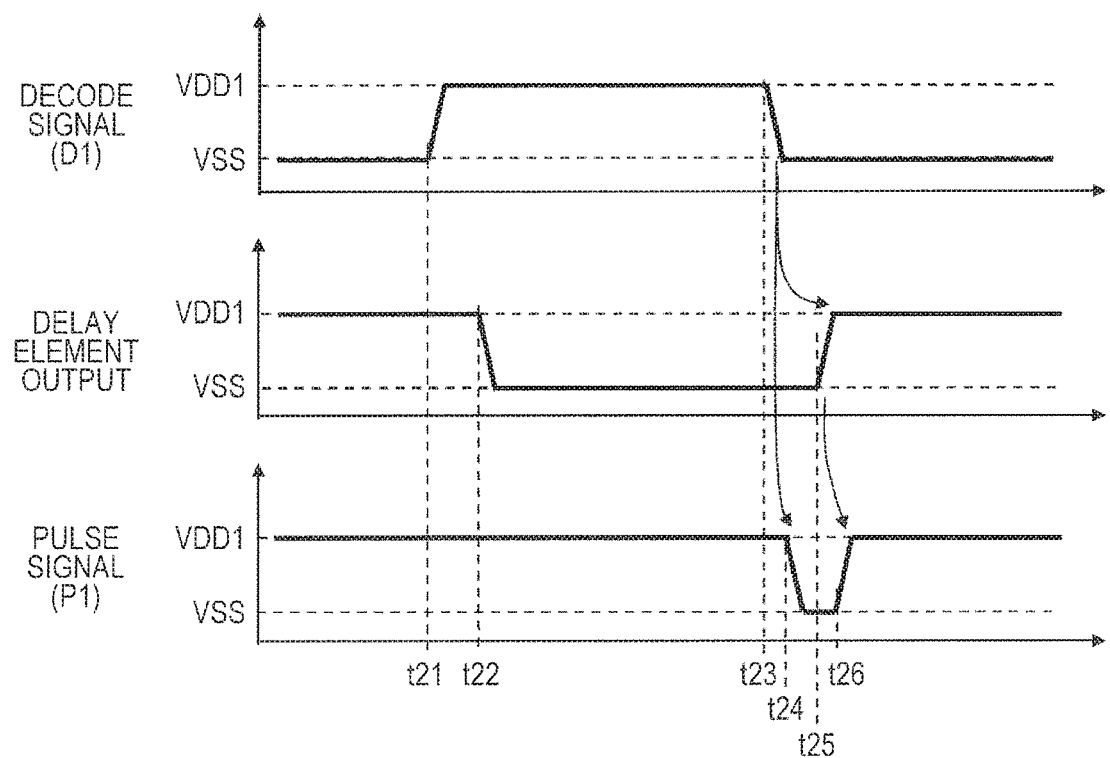
FIG. 3 is a timing chart for showing an operation of the pulse signal generation unit shown in FIG. 1.

FIG. 3 is a timing chart for showing an operation of the pulse signal generation unit 15_1.

As shown in FIG. 3, when the decode signal D1 rises (time t21), the output signal of the delay element 151 falls thereafter (time t22). At this time, the pulse signal P1 is maintained at the H level. Thereafter, when the decode signal D1 falls (time t23), the output signal of the delay element 151 rises thereafter (time t25). At this time, the pulse signal P1 falls in accordance with falling of the decode signal D1 (time t24), and rises in accordance with rising of the output signal of the delay element 151 (time t26). That is, the pulse signal P1 temporarily falls (time t24 to t26).

The explanation will be continued with reference to FIG. 1 again.

The word line drivers 12_1 to 12_n drive the decode signals D1 to Dn to be output to the word lines WL1 to WLn, respectively. Hereinafter, the signals output to the word lines WL1 to WLn are referred to as word line signals W1 to Wn.

The memory cell array 13 is configured using a plurality of memory cells arranged in a matrix manner having, for example, n rows and m columns (n and m are natural numbers). When reading data, the word line designated by the address signal AD1 among the n word lines WL1 to WLn is activated (indicating the H level), and all other word lines are inactivated (indicating the L level). Accordingly, pieces of data stored in the memory cells in m columns provided in association with the activated word lines propagate through m bit lines.

The sense amplifier 14 amplifies the data propagating through the bit line designated (selected) by the address signal AD1 among those propagating through the m bit lines, and outputs the amplified data as read data.

(Concrete Configuration of Word Line Driver 12)

Figure 4:
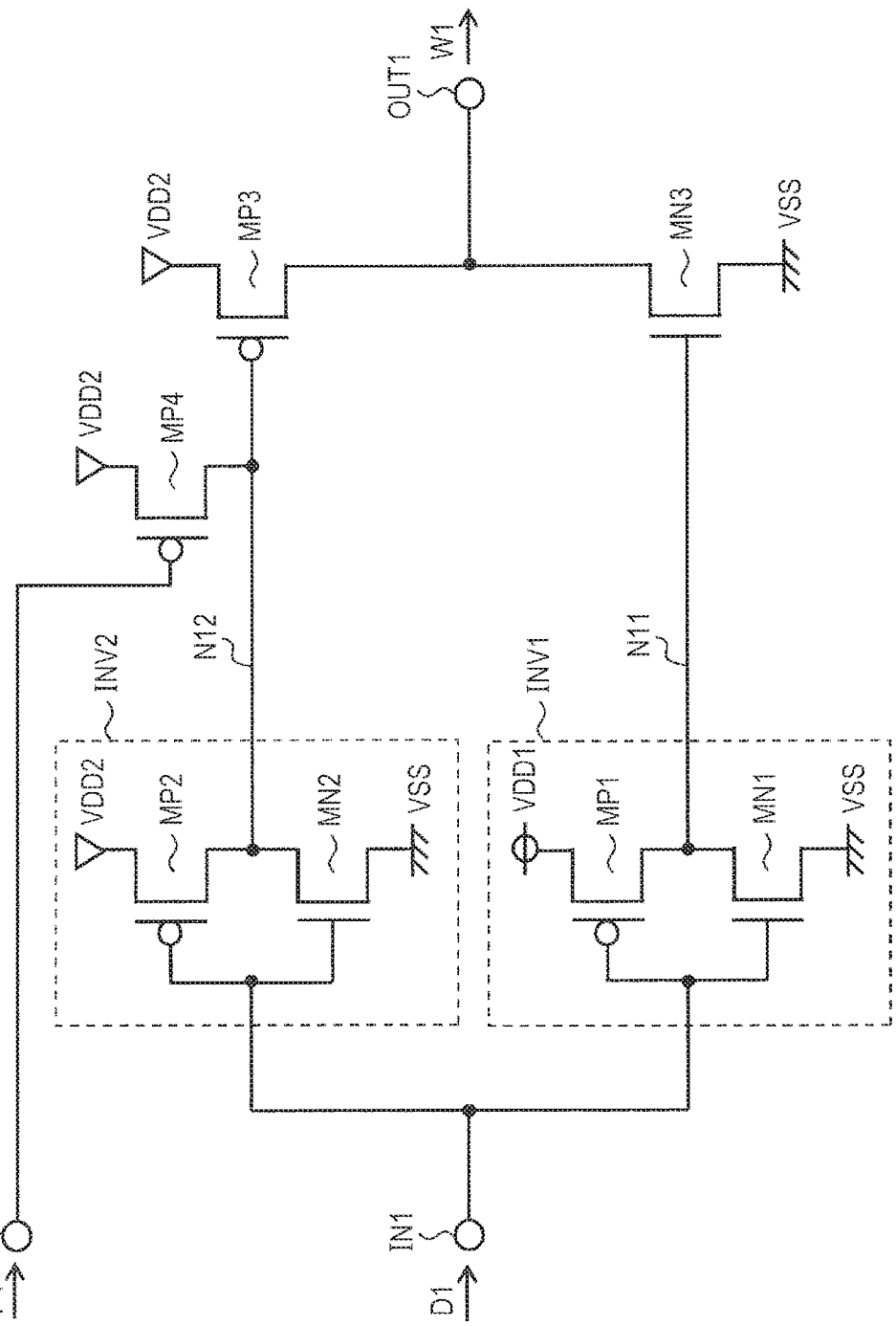
FIG. 4 is a circuit diagram for showing a concrete configuration example of a word line driver provided in the semiconductor device shown in FIG. 1.

FIG. 4 is a circuit diagram for showing a concrete configuration example of the word line driver 12. FIG. 4 exemplifies a case in which the word line driver 12 is the word line driver 12_1 in the first row. However, the same applies to cases of the word line drivers 12_2 to 12_n.

As shown in FIG. 4, the word line driver 12_1 includes PMOS transistors MP1 to MP4 and NMOS transistors MN1 to MN3. An inverter INV1 is configured using the transistors MP1 and MN1. An inverter INV2 is configured using the transistors MP2 and MN2.

In the transistor MP1 configuring the inverter INV1, the source is coupled to a power supply voltage terminal VDD1, the drain is coupled to a node N11, and the gate is coupled to an input terminal IN1 to which the decode signal D1 is supplied. In the transistor MN1, the source is coupled to a reference voltage terminal VSS, the drain is coupled to the node N11, and the gate is coupled to the input terminal IN1.

In the transistor MP2 configuring the inverter INV2, the source is coupled to a power supply voltage terminal VDD2, the drain is coupled to a node N12, and the gate is coupled to the input terminal IN1. In the transistor MN2, the source is coupled to the reference voltage terminal VSS, the drain is coupled to the node N12, and the gate is coupled to the input terminal IN1.

The transistor MP3 is a pull-up element, and controls a current flowing from the power supply voltage terminal VDD2 to an output terminal OUT1 on the basis of the output voltage of the inverter INV2. Specifically, in the transistor MP3, the source is coupled to the power supply voltage terminal VDD2, the drain is coupled to the output terminal OUT1, and the gate is coupled to the output of the inverter INV2.

The transistor MN3 is a pull-down element, and controls a current flowing from the output terminal OUT1 to the reference voltage terminal VSS on the basis of the output voltage of the inverter INV1. Specifically, in the transistor MN3, the source is coupled to the reference voltage terminal VSS, the drain is coupled to the output terminal OUT1, and the gate is coupled to the output of the inverter INV1.

The transistor MP4 is a pull-up element provided to hasten the off operation of the transistor MP3, and is temporarily turned on by the pulse signal P1 that temporarily falls in synchronization with falling of the decode signal D1. Specifically, in the transistor MP4, the source is coupled to the power supply voltage terminal VDD2, the drain is coupled to the gate of the transistor MP3, and the gate is coupled to an input terminal IN2 to which the pulse signal P1 is supplied.

Here, since the inverter INV1 is driven by the power supply voltage VDD1 in the word line driver 12_1, the power supply voltage VDD2 is steadily applied between the gate and the source of only the transistor MP2 in the non-selection state. That is, there is a possibility that the TDDB occurs only in the transistor MP2 in the word line driver 12_1, and the transistor MN3 is excluded. Therefore, the occurrence of the TDDB can be reduced in the word line driver 12_1 as compared to the case of the word line driver 52_1.

Further, the size of the gate of the transistor MN3 is generally more than three times the size of the gate of the transistor MP2. Thus, the probability of occurrence of the TDDB can be considerably reduced in the word line driver 12_1 by excluding the transistor MN3 from the target of the occurrence of the TDDB. As a result, the reliability of the semiconductor device 1 can be improved.

It should be noted that since the probability of occurrence of the TDDB is reduced, the driving capability of the word line driver 12_1 can be enhanced by setting the value of the power supply voltage VDD2 larger than that in the case of the word line driver 52_1.

(Operation of Word Line Driver 12)

Figure 5:
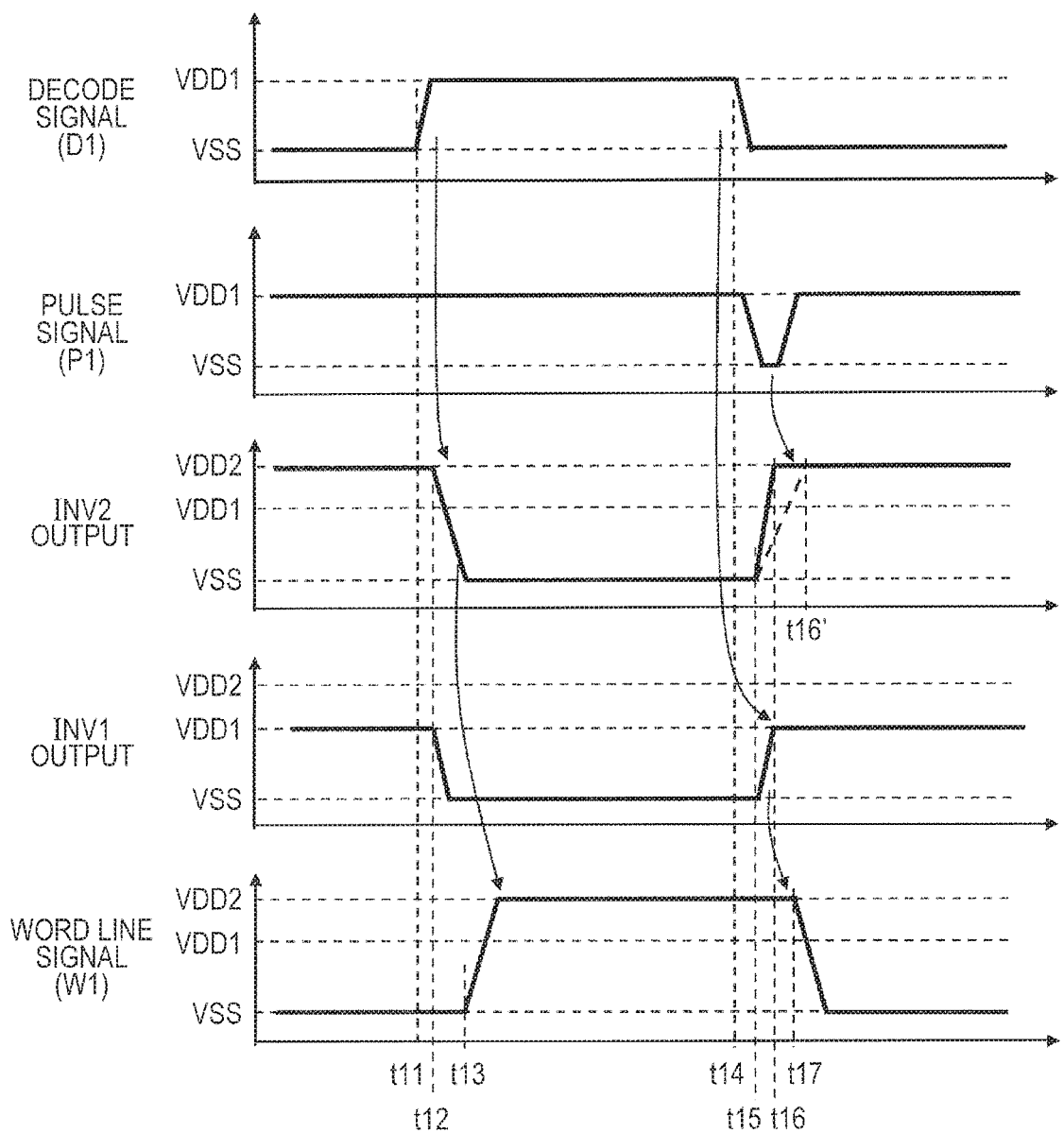
FIG. 5 is a timing chart for showing an operation of the word line driver shown in FIG. 4.

FIG. 5 is a timing chart for showing an operation of the word line driver 12. FIG. 5 exemplifies a case in which the word line driver 12 is the word line driver 12_1 in the first row. However, the same applies to cases of the word line drivers 12_2 to 12_n.

In the case where a data reading operation is performed, one of n decode signals D1 to Dn output from the address decoder 11 rises. In the example of FIG. 5, the decode signal D1 rises (time t11). Accordingly, the output signal of each of the inverters INV1 and INV2 falls (time t12). Accordingly, the transistor MP3 is turned on, and the transistor MN3 is turned off. Thus, the word line signal W1 is activated. That is, the word line signal W1 rises (time t13).

Thereafter, when the data reading operation is completed, the decode signal D1 falls (time t14). Accordingly, the output signal of each of the inverters INV1 and INV2 starts to rise (time t15). When the output signal of each of the inverters INV1 and INV2 rises (time t16), the transistor MP3 is turned off, and the transistor MN3 is turned on. Thus, the word line signal W1 is inactivated. That is, the word line signal W1 falls (time t17). It should be noted that the transistors MP4 and MP2 are not completely turned off during the period (time t11 to t14) when the decode signal D1 is being activated because a potential difference between the gate and the source of each transistor corresponds to a difference between VDD2 and VDD1. Therefore, some through-current flows into each of the transistors MP4 and MN2 and the transistors MP2 and MN2. However, if the power supply voltage VDD2 is equal to or smaller than a voltage value obtained by adding the threshold voltage (absolute value) of the PMOS transistor to the power supply voltage VDD1, the through-current becomes small. Further, the period in which the decode signal D1 is being activated is limited. Thus, it is assumed that the through-current is negligibly small in the embodiment. Further, the transistor MP4 is not completely turned off even after (after time t17) the word line signal W1 is inactivated. At this time, however, since the transistor MP2 is turned on and the gate voltage (the voltage of the node 12) of the transistor MP3 rises to the level of the power supply voltage VDD2, there is no problem even if the transistor MP4 is not completely turned off.

Here, the inverter INV1 is driven by the power supply voltage VDD1, and the inverter INV2 is driven by the power supply voltage VDD2 higher than the power supply voltage VDD1. Therefore, the time (time t16') when the output signal of the inverter INV2 rises to the level of the power supply voltage VDD2 is later than the time (time t16) when the output signal of the inverter INV1 rises to the level of the power supply voltage VDD1 if no measures are taken. Accordingly, the transistor MN3 is fully turned on before the transistor MP3 is turned off. Accordingly, since the transistors MP3 and MN3 are turned on at the same time in the period (time t16 to t16') from the time when the transistor MN3 is fully turned on to the time when the transistor MP3 is turned off, the through-current is increased, resulting in an increase in power consumption.

Thus, in the word line driver 12_1 according to the embodiment, the transistor MP4 is temporarily turned on by the pulse signal P1 that temporarily falls in synchronization with falling of the decode signal D1. Accordingly, electrical charges are rapidly accumulated to the gate of the transistor MP3 through the transistor MP4 from the power supply voltage terminal VDD2, and the gate voltage of the transistor MP3 rapidly rises. Thus, the transistor MP3 is immediately switched from on to off.

Accordingly, the time when the transistor MP3 is turned off can be advanced to around the time (time t16) when the transistor MN3 is fully turned on. Accordingly, the period from the time when the transistor MN3 is fully turned on to the time when the transistor MP3 is turned off can be shortened (ideally eliminated). Thus, the through-current is suppressed from being increased, and as a result, the power consumption is suppressed from being increased.

It should be noted that the pulse signal P1 is changed from the L level to the H level (the level of the power supply voltage VDD1) after the gate voltage of the transistor MP3 sufficiently rises. Accordingly, it is possible to prevent the power supply voltage VDD2 from being steadily applied between the gate and the source of the transistor MP4. As a result, it is possible to prevent the TDDB from occurring in the transistor MP3.

Further, the time when the pulse signal P1 falls is preferably as near as possible (ideally matches) to the time when the decode signal D1 falls. For example, if the time when the pulse signal P1 falls becomes much faster than the time when the decode signal D1 falls, the transistor MP4 is turned on before the transistor MN2 is turned off. Thus, the through-current flowing in the transistors MP4 and MN2 is increased. On the other hand, if the time when the pulse signal P1 falls becomes much slower than the time when the decode signal D1 falls, the transistor MP cannot be immediately turned off. Thus, the through-current flowing in the transistors MP3 and MN3 is increased.

It should be noted that since the through-current is suppressed from being increased, it is not necessary to enlarge the size of the transistor MP2 or to reduce the size of the transistor MP1. Therefore, the high reliability and the high-speed operation can be maintained.

As described above, in the semiconductor device 1 according to the embodiment, each word line driver includes the transistor MP4 that is provided between the power supply voltage terminal VDD2 and the gate of the transistor MP3 in the output stage and that is temporarily turned on in synchronization with falling of the decode signal. Accordingly, since the transistor MP3 in the output stage can be immediately turned off in the semiconductor device 1 according to the embodiment, the period in which the transistors MP3 and MN3 in the output stage are turned on at the same time can be shortened. As a result, the through-current flowing in the transistors MP3 and MN3 in the output stage can be suppressed from being increased. That is, the reliability of the semiconductor device 1 according to the embodiment can be improved without increasing the power consumption.

Second Embodiment

Figure 6:
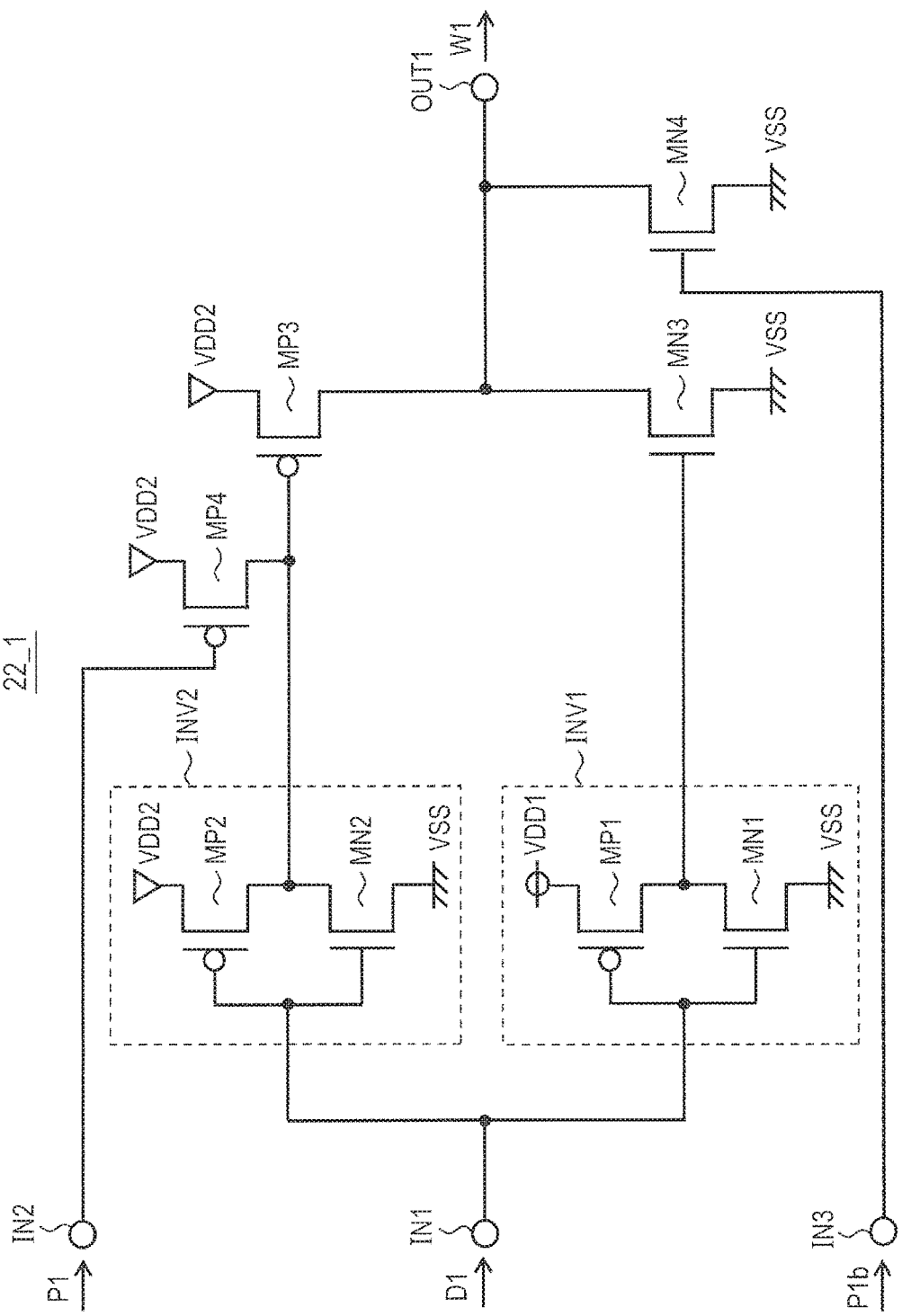
FIG. 6 is a circuit diagram for showing a concrete configuration example of a word line driver provided in a semiconductor device according to a second embodiment.

FIG. 6 is a diagram for showing a configuration example of a word line driver 22 provided in a semiconductor device 2 according to a second embodiment. It should be noted that the word line driver 22 corresponds to the word line driver 12 of the semiconductor device 1. FIG. 6 exemplifies a case in which the word line driver 22 is a word line driver 22_1 in the first row. However, the same applies to cases of word line drivers 22_2 to 22_n.

As shown in FIG. 6, the word line driver 22_1 further includes an N-channel MOS transistor MN4 as compared to the word line driver 12_1. The other configurations of the word line driver 22_1 are the same as those of the word line driver 12_1, and thus the explanation thereof will be omitted.

The transistor MN4 is a pull-down element provided to hasten the extraction of electrical charges of an output terminal OUT1, and is temporarily turned on by a pulse signal P1*b* that temporarily rises in synchronization with falling of a decode signal D1. The pulse signal P1*b* is, for example, an inverted signal of a pulse signal P1. Specifically, in the transistor MN4, the source is coupled to a reference voltage terminal VSS, the drain is coupled to the output terminal OUT1, and the gate is coupled to an input terminal IN3 to which the pulse signal P1*b* is supplied.

It should be noted that the size ratio of the transistor MN4 to the transistor MN3 is not particularly limited, but the size of the transistor MN3 is desirably smaller than that of the transistor MN4. Specifically, the size of the transistor MN3 is about one-third of that of the transistor MN4.

(Operation of Word Line Driver 22)

Figure 7:
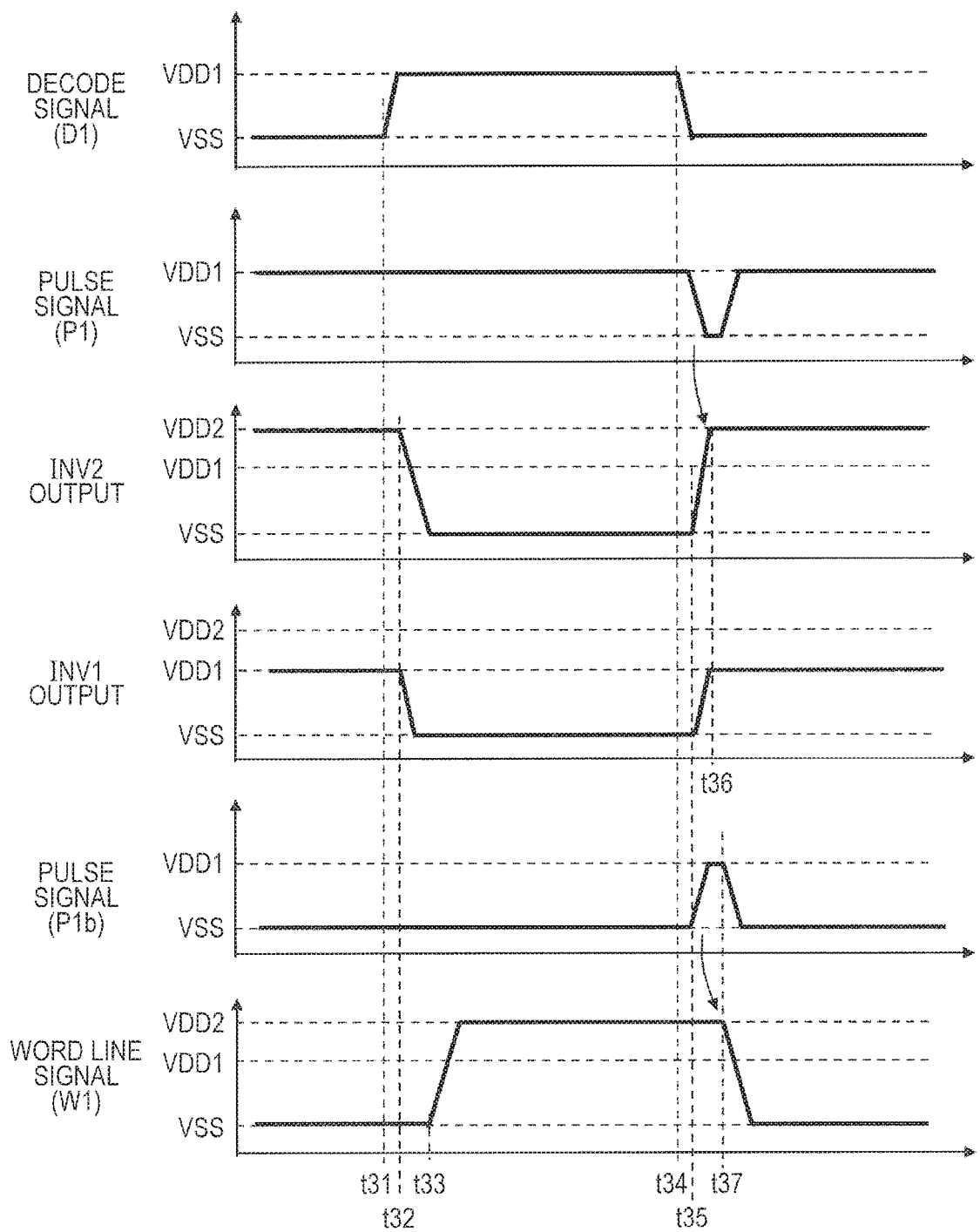
FIG. 7 is a timing chart for showing an operation of the word line driver shown in FIG. 6.

FIG. 7 is a timing chart for showing an operation of the word line driver 22. FIG. 7 exemplifies a case in which the word line driver 22 is the word line driver 22_1 in the first row. However, the same applies to cases of the word line drivers 22_2 to 22_n.

In the case where a data reading operation is performed, one of n decode signals D1 to Dn output from an address decoder 11 rises. In the example of FIG. 7, the decode signal D1 rises (time t31). Accordingly, the output signal of each of inverters INV1 and INV2 falls (time t32). Accordingly, the transistor MP3 is turned on, and the transistor MN3 is turned off. Thus, a word line signal W1 is activated. That is, the word line signal W1 rises (time t33).

Thereafter, when the data reading operation is completed, the decode signal D1 falls (time t34). Accordingly, the output signal of each of the inverters INV1 and INV2 starts to rise (time t35). When the output signal of each of the inverters INV1 and INV2 rises (time t36), the transistor MP3 is turned off, and the transistor MN3 is turned on. Thus, the word line signal W1 is inactivated. That is, the word line signal W1 falls (time t37).

Here, in the word line driver 22_1 according to the embodiment, the transistor MP4 is temporarily turned on by the pulse signal P1 that temporarily falls in synchronization with falling of the decode signal D1. Accordingly, electrical charges are rapidly accumulated to the gate of the transistor MP3 through the transistor MP4 from a power supply voltage terminal VDD2, and the gate voltage of the transistor MP3 rapidly rises. Thus, the transistor MP3 is immediately switched from on to off.

Accordingly, the time when the transistor MP3 is turned off can be advanced to around the time (time t36) when the transistor MN3 is fully turned on. Accordingly, the period from the time when the transistor MN3 is fully turned on to the time when the transistor MP3 is turned off can be shortened (ideally eliminated). Thus, the through-current is suppressed from being increased, and as a result, the power consumption is suppressed from being increased.

It should be noted that it is actually difficult in some cases that the time when the transistor MP3 is turned off completely matches the time when the transistor MN3 is fully turned on. Thus, in the word line driver 22_1 according to the embodiment, the transistor MN4 is temporarily turned on by the pulse signal P1b that temporarily rises in synchronization with falling of the decode signal D1. Accordingly, the electrical charges of the output terminal OUT1 are extracted through not only the transistor MN3 but also the transistor MN4. Accordingly, since the size of the transistor MN3 in which the through-current flows can be reduced, the through-current is reduced. For example, in the case where the size of the transistor MN3 is one-third of that of the transistor MN4, the through-current is reduced to about one-fourth.

Third Embodiment

Figure 8:
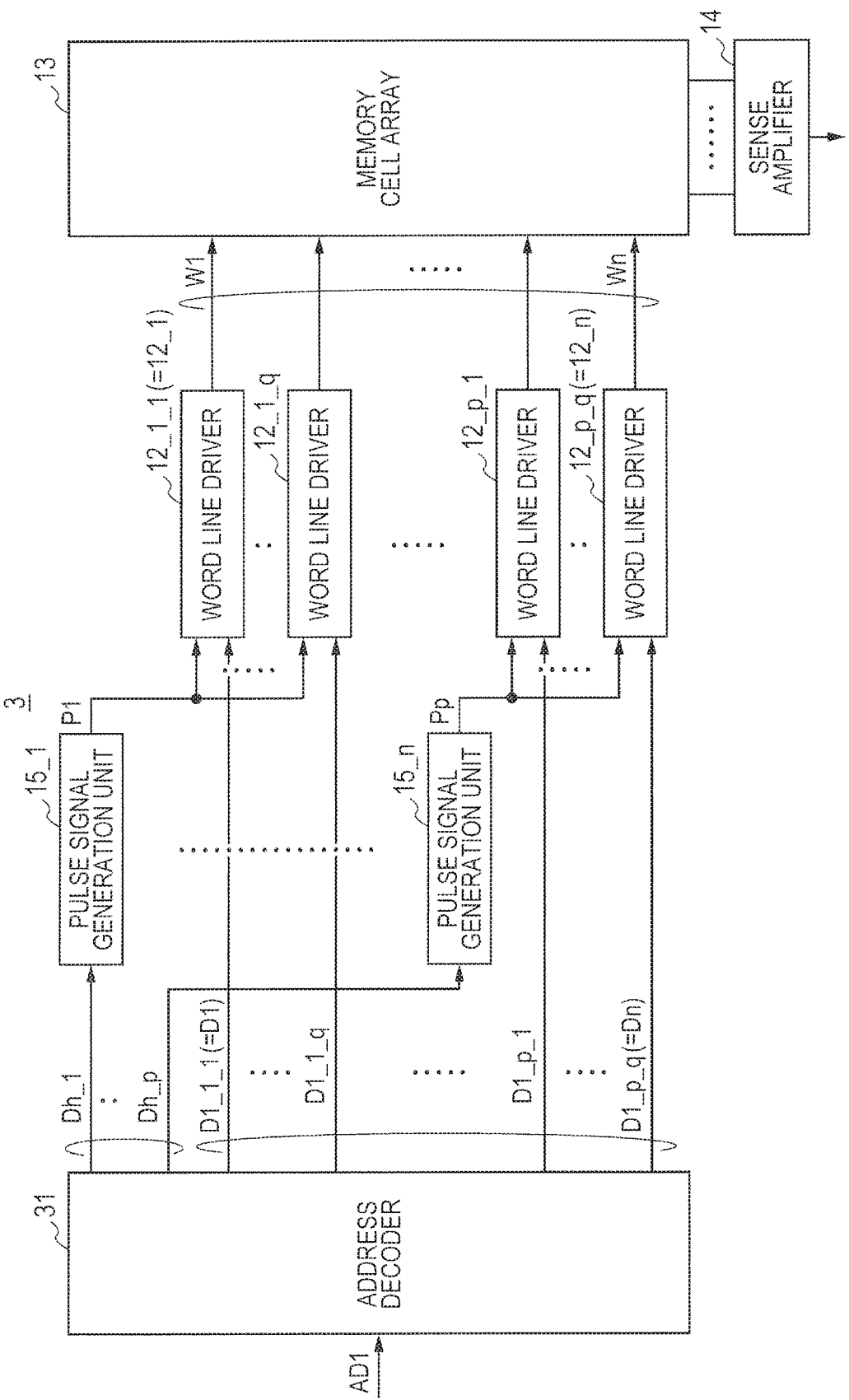
FIG. 8 is a block diagram for showing a configuration example of a semiconductor device according to a third embodiment.

FIG. 8 is a block diagram for showing a configuration example of a semiconductor device 3 according to a third embodiment. The semiconductor device 3 is different from the semiconductor device 1 in the structure of the address decoder, and the number of pulse signal generation units 15 is different. Hereinafter, the third embodiment will be specifically described.

Specifically, the semiconductor device 3 includes, at least, an address decoder 31, n word line drivers 12, a memory cell array 13, a sense amplifier 14, and p (p is a natural number smaller than n) pulse signal generation units 15.

In the following description, the p pulse signal generation units 15 are also referred to as pulse signal generation units 15_1 to 15_p. Further, q (q is n/p) word line drivers 12 to which pulse signals Pi are supplied from pulse signal generation units 15_i (i is a natural number from 1 to p) among the n word line drivers 12 are also referred to as word line drivers 12_i_1 to 12_i_q. It should be noted that the word line driver 12_1_1 corresponds to the word line driver 12_1, and the word line driver 12_p_q corresponds to the word line driver 12_n.

(Concrete Configuration Example of Address Decoder 31)

Figure 9:
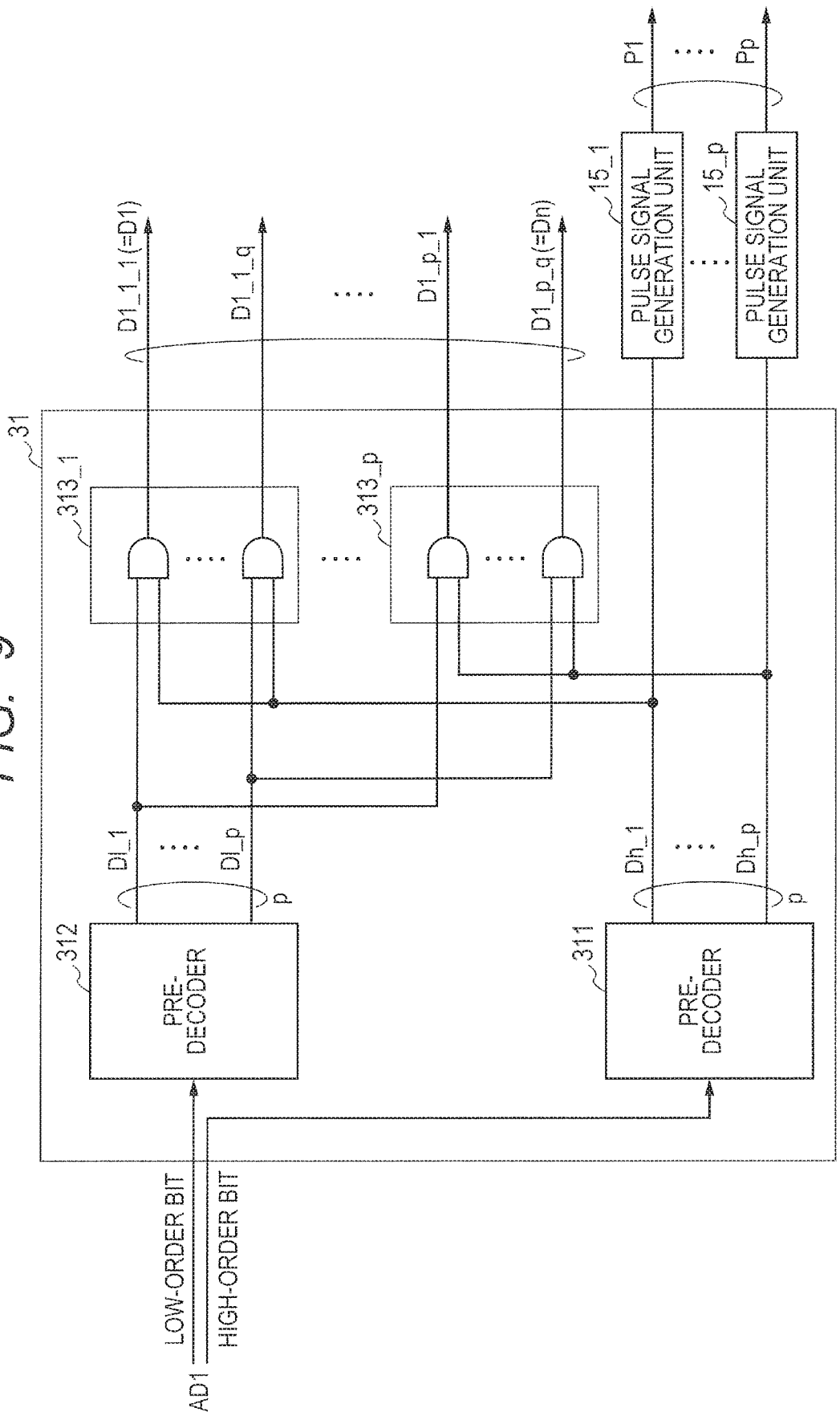
FIG. 9 is a diagram for showing a configuration example of an address decoder provided in the semiconductor device shown in FIG. 8.

FIG. 9 is a diagram for showing a concrete configuration example of the address decoder 31. It should be noted that FIG. 9 shows the p pulse signal generation units 15_1 to 15_p in addition to the address decoder 31.

As shown in FIG. 9, the address decoder 31 includes pre-decoders 311 and 312 and p AND circuit groups 313_1 to 313_p.

The pre-decoder 311 decodes, for example, an address signal (hereinafter, referred to as a high-order address signal) configured using high-order bits among a plurality of bits configuring an address signal AD1, and outputs pre-decode signals Dh_1 to Dh_p. The pre-decoder 312 decodes, for example, an address signal (hereinafter, referred to as a low-order address signal) configured using the remaining low-order bits among the bits configuring the address signal AD1, and outputs pre-decode signals Dl_1 to Dl_q.

Each of the AND circuit groups 313_1 to 313_p is configured using q AND circuits. The AND circuit group 313_i (i is a natural number from 1 to p) multiplies the pre-decode signal Dh_i output from the pre-decoder 311 by the pre-decode signals Dl_1 to Dl_q output from the pre-decoder 312, and outputs the results as the decode signals D1_i_1 to D1_i_q. It should be noted that the decode signal D1_1_1 corresponds to the decode signal D1, and the decode signal D1_p_q corresponds to the decode signal Dn.

The pre-decode signals Dh_1 to Dh_p output from the pre-decoder 311 are supplied to the pulse signal generation units 15_1 to 15_p, respectively.

The explanation will be continued with reference to FIG. 8 again.

The pulse signal generation units 15_1 to 15_p output the pulse signals P1 to Pp that temporarily fall in synchronization with falling of the pre-decode signals Dh_1 to Dh_p, respectively. The pulse signal Pi (i is a natural number from 1 to p) is supplied to the q word line drivers 12_i_1 to 12_i_q.

The word line drivers 12_i_1 to 12_i_q drive the decode signals D1_i_1 to D1_i_q to be output to word lines WL1_i_1 to WL1_i_q, respectively. It should be noted that the word line WL1_1_1 corresponds to the word line WL1, and the word line WL1_p_q corresponds to the word line WLn.

The other configurations of the semiconductor device 3 are the same as those of the semiconductor device 1, and thus the explanation thereof will be omitted.

As described above, the semiconductor device 3 according to the embodiment generates only the pulse signals P1 to Pp having a p (p<n)-bit width on the basis of the pre-decode signal having a p-bit width generated by decoding the high-order address signal instead of generating the n pulse signals P1 to Pn on the basis of the n decode signals generated by decoding the address signal AD1. Accordingly, the semiconductor device 3 according to the embodiment can reduce the number of pulse signal generation units 15, and thus the circuit scale can be suppressed from being increased.

The semiconductor device 3 according to the embodiment generates each of the decode signals D1 to Dn and the pulse signals P1 to Pp on the basis of the pre-decode signal having a p-bit width generated by decoding the high-order address signal. Accordingly, the falling timing of the decode signals D1 to Dn and the falling timing of the pulse signals P1 to Pp can be easily aligned, and thus the through-current flowing in the transistors MP3 and MN3 provided in each of the word line drivers 12 can be suppressed from being increased.

In the embodiment, a case in which the semiconductor device 3 includes the word line drivers 12_1 to 12_n is described as an example. However, the present invention is not limited to this, but the semiconductor device 3 may include the word line drivers 22_1 to 22_n.

Fourth Embodiment

Figure 10:
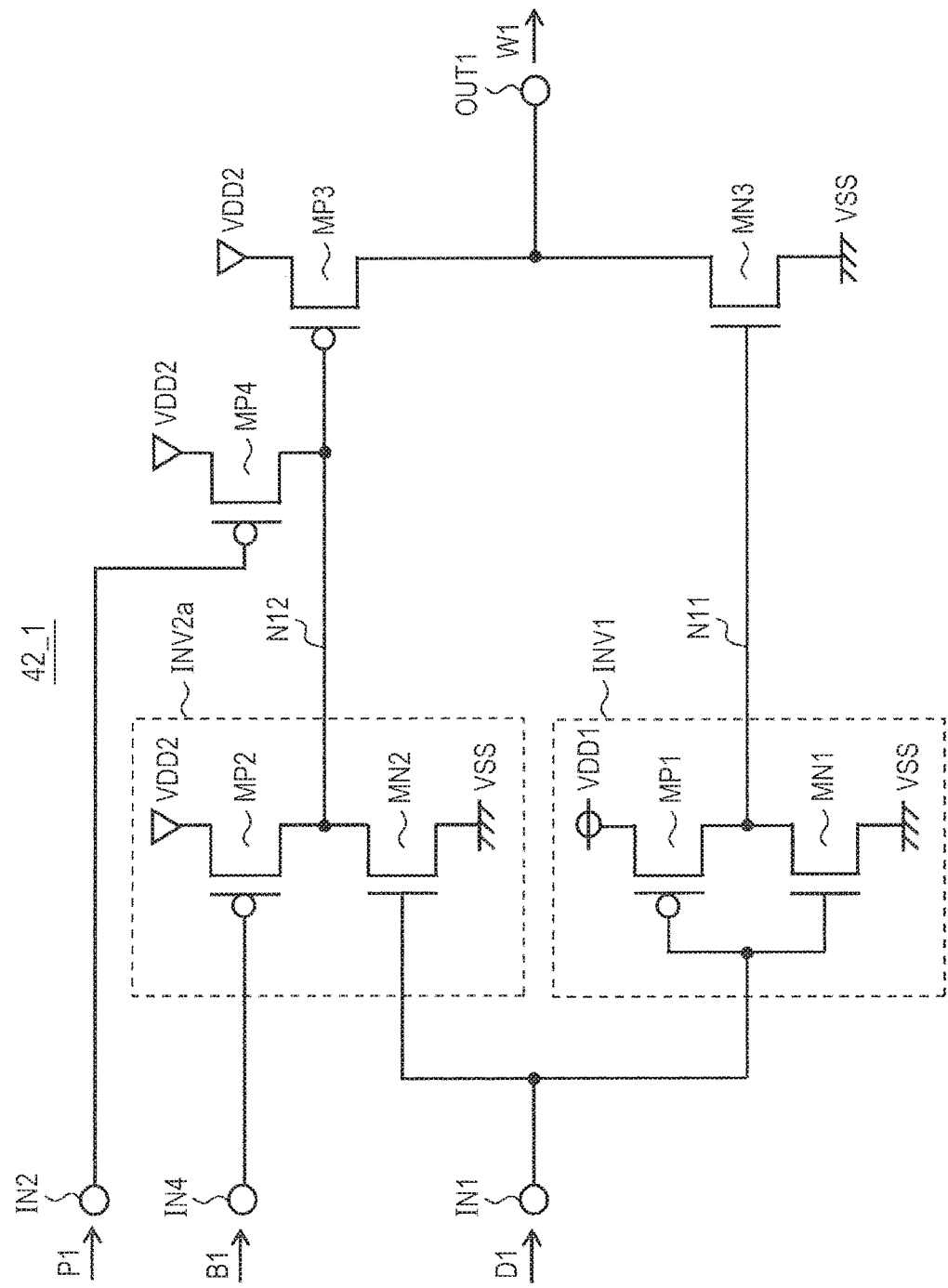
FIG. 10 is a circuit diagram for showing a concrete configuration example of a word line driver provided in a semiconductor device according to a fourth embodiment.

FIG. 10 is a diagram for showing a configuration example of a word line driver 42 provided in a semiconductor device 4 according to a fourth embodiment. It should be noted that the word line driver 42 corresponds to the word line driver 12 of the semiconductor device 1. FIG. 10 exemplifies a case in which the word line driver 42 is a word line driver 42_1 in the first row. However, the same applies to cases of word line drivers 42_2 to 42_n.

As shown in FIG. 10, the word line driver 42_1 includes an inverter INV2a instead of the inverter INV2 as compared to the word line driver 12_1. In the inverter INV2a, the gate of the transistor MP2 is coupled to an input terminal IN4 to which a bias signal B1 is supplied. The other configurations of the inverter INV2a are the same as those of the inverter INV2, and thus the explanation thereof will be omitted.

For example, the bias signal B1 is activated in the case where an internal power supply circuit is started when the standby mode is switched to the normal operation mode.

Figure 11:
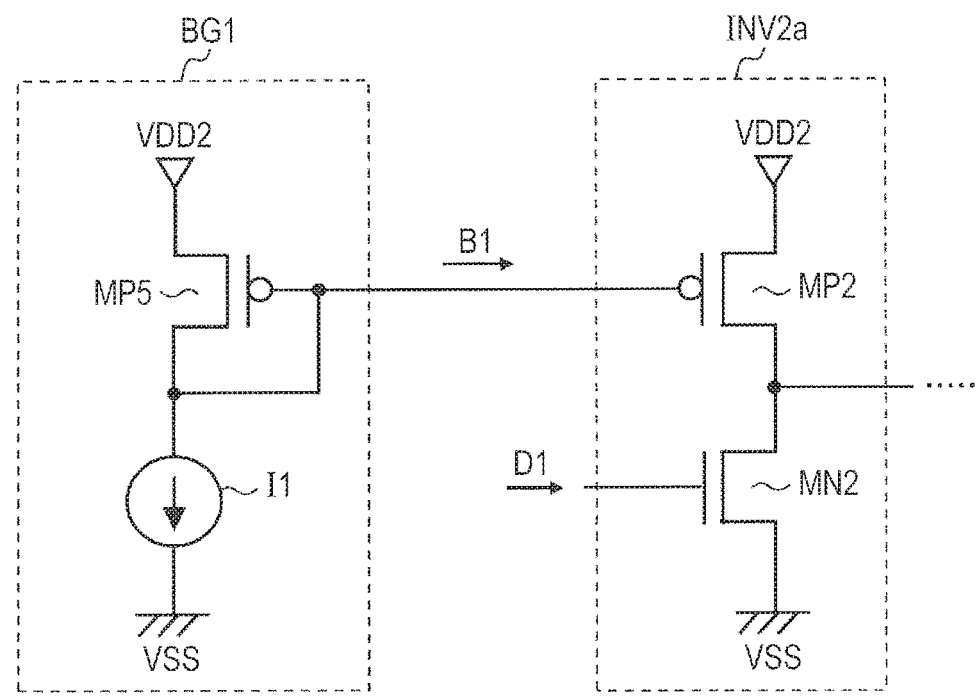
FIG. 11 is a diagram for showing a configuration example of a bias generation circuit.

FIG. 11 is a diagram for showing a configuration example of a bias generation circuit BG1. It should be noted that the inverter INV2a is also shown in FIG. 11.

As shown in FIG. 11, the bias generation circuit BG1 includes a P-channel MOS transistor MP5 and a constant current source I1. In the transistor MP5, the source is coupled to a power supply voltage terminal VDD2, and the drain and the gate are coupled to the output terminal of the bias generation circuit BG1. The input terminal of the constant current source I1 is coupled to the output terminal of the bias generation circuit BG1, and the output terminal of the constant current source I1 is coupled to a reference voltage terminal VSS.

Here, the transistor MP5 provided in the bias generation circuit BG1 and the transistor MP2 provided in the inverter INV2a are coupled to each other in a current mirror manner. Therefore, a current proportional to a current (a current flowing in the constant current source I1) flowing between the source and the drain of the transistor MP5 always flows between the source and the drain of the transistor MP2.

On the contrary, a current flowing between the source and the drain of the transistor MN2 differs depending on the voltage level of an input signal D1. For example, in the case where the input signal D1 is activated to indicate the H level, a constant current flows between the source and the drain of the transistor MN2. At this time, the node N12 (the gate of the transistor MP3) is discharged by the transistor MN2, and thus the L level is indicated. It should be noted that in order to maintain the stable operation and the high-speed operation, the current flowing between the source and the drain of the transistor MP2 is adjusted so as to be substantially smaller than that flowing between the source and the drain of the transistor MN2.

On the other hand, in the case where the input signal D1 is inactivated to indicate the L level, the current flowing between the source and the drain of the transistor MN2 stops. At this time, the node N12 (the gate of the transistor MP3) is charged by the transistor MP4 having a large driving capability, and thus the H level is indicated. It should be noted that although the transistor MP4 is turned off after the charging of the node N12 is completed, the node N12 is maintained at the H level because the transistor MP3 is turned on at a high degree of resistance.

Here, the threshold voltage of the transistor MP5 is merely applied between the gate and the source of the transistor MP5 provided in the bias generation circuit BG1, and the high power supply voltage VDD2 is not steadily applied. Likewise, the threshold voltage of the transistor MP5 is only applied between the gate and the source of the transistor MP2 provided in the inverter INV2a of each word line driver, and the high power supply voltage VDD2 is not steadily applied. Therefore, the occurrence of the TDDB in the transistors MP5 and MP2 is suppressed.

It should be noted that the bias generation circuit BG1 can be shared by the word line drivers, and thus does not largely affect an increase in current consumption.

As described above, in each of the semiconductor devices 1 to 4 according to the above-described first to fourth embodiments, each word line driver includes the transistor MP4 that is provided between the power supply voltage terminal VDD2 and the gate of the transistor MP3 in the output stage and that is temporarily turned on in synchronization with falling of the decode signal. Accordingly, in each of the semiconductor devices 1 to 4 according to the above-described first to fourth embodiments, the transistor MP3 in the output stage can be immediately turned off, and thus the period in which the transistors MP3 and MN3 in the output stage are turned on at the same time can be shortened. As a result, the through-current flowing in the transistors MP3 and MN3 in the output stage can be suppressed from being increased. That is, in each of the semiconductor devices 1 to 4 according to the above-described first to fourth embodiments, the reliability can be improved without increasing the power consumption.

At this time, it is not necessary to enlarge the size of the transistor MP2 or to reduce the size of the transistor MP1 in order to suppress the through-current from being increased. Therefore, the high reliability and the high-speed operation of each of the semiconductor devices 1 to 3 can be maintained.

The invention achieved by the inventors has been concretely described above on the basis of the embodiments. However, it is obvious that the present invention is not limited to the above-described embodiments, and can be variously changed without departing from the scope thereof.

For example, each of the semiconductor devices according to the above-described embodiments may be configured to invert the conductive type (p-type or n-type) of a semiconductor substrate, a semiconductor layer, a diffusion layer (diffusion area), and the like. Therefore, in the case where one conductive type of the n-type and p-type is a first conductive type and the other is a second conductive type, the first conductive type can be the p-type, and the second conductive type can be the n-type. On the contrary, the first conductive type can be the n-type, and the second conductive type can be the p-type.

What is claimed is:

1. A driving circuit comprising:
   a first inverter that is driven by a first power supply voltage and inverts and outputs a first input signal;
   a second inverter that is driven by a second power supply voltage higher than the first power supply voltage and inverts and outputs the first input signal;
   a first PMOS transistor that controls a current flowing to an external output terminal from a power supply voltage terminal to which the second power supply voltage is supplied on the basis of an output signal of the second inverter;
a first NMOS transistor that controls a current flowing to a reference voltage terminal from the external output terminal on the basis of an output signal of the first inverter;
a second PMOS transistor that is provided between the power supply voltage terminal to which the second power supply voltage is supplied and a gate of the first PMOS transistor; and
a signal generation circuit having an output terminal coupled to a gate of the second PMOS transistor,
wherein the gate of the second PMOS transistor receives a second input signal, and
wherein the signal generation circuit is configured to generate the second input signal in synchronization with falling of the first input signal.

2. The driving circuit according to claim 1, wherein the signal generation circuit has:
a delay circuit that delays and outputs the inverted signal of the first input signal; and
an OR circuit that outputs a logical sum of the first input signal and an output signal of the delay circuit as the second input signal.

3. The driving circuit according to claim 1, further comprising a second NMOS transistor that is provided in parallel with the first NMOS transistor and is temporarily turned on in synchronization with falling of the first input signal.

4. The driving circuit according to claim 3, wherein the size of the first NMOS transistor is smaller than that of the second NMOS transistor.

5. The driving circuit according to claim 3, wherein a third input signal that temporarily rises in synchronization with falling of the first input signal is supplied to the gate of the second NMOS transistor.

6. The driving circuit according to claim 1, wherein the first inverter includes:
a third PMOS transistor that is provided between the power supply voltage terminal to which the second power supply voltage is supplied and the output terminal of the first inverter and to the gate of which a predetermined bias signal is supplied; and
a third NMOS transistor that is provided between the reference voltage terminal and the output terminal of the first inverter and to the gate of which the first input signal is supplied.

7. A semiconductor device comprising:
an address decoder that decodes an address signal to generate a plurality of decode signals;
the driving circuits according to claim 1 that drive the decode signals that are the first input signals to be output to a plurality of word lines; and
a memory cell array in which data stored in a memory cell at a designated address is read on the basis of an activation state of each of the word lines and a plurality of bit lines.

8. The semiconductor device according to claim 7, wherein each of the signal generation circuits has:
a delay circuit that delays and outputs the inverted signal of the decode signal; and
an OR circuit that outputs a logical sum of the decode signal and an output signal of the delay circuit as the second input signal.

9. The semiconductor device according to claim 7, wherein each of the driving circuits includes a second NMOS transistor that is provided in parallel with the first NMOS transistor and is temporarily turned on in synchronization with falling of the first input signal.

10. The semiconductor device according to claim 9, wherein the size of the first NMOS transistor is smaller than that of the second NMOS transistor.

11. The semiconductor device according to claim 9, wherein a plurality of third input signals that temporarily rises in synchronization with falling of the decode signals are supplied to the gates of the second NMOS transistors provided respectively in the driving circuits.

12. The semiconductor device according to claim 7, wherein the address decoder has:
a first pre-decoder that decodes a high-order address signal represented by high-order bits among those configuring the address signal to generate a plurality of first pre-decode signals;
a second pre-decoder that decodes a low-order address signal represented by the remaining bits among those configuring the address signal to generate a plurality of second pre-decode signals; and
a decode signal generation unit that generates the decode signals on the basis of the first pre-decode signals and the second pre-decode signals,
wherein the semiconductor device further includes a plurality of signal generation circuits that generates a plurality of second input signals that temporarily falls in synchronization with falling of the first pre-decode signals, and
wherein a common second input signal is input to the driving circuits to which the decode signals generated on the basis of a common first pre-decode signal are input.

13. A control method of a driving circuit comprising the steps of:
inverting and outputting a first input signal using a first inverter driven by a first power supply voltage;
inverting and outputting the first input signal using a second inverter that is driven by a second power supply voltage higher than the first power supply voltage;
controlling a current flowing in a first PMOS transistor provided between a power supply voltage terminal to which the second power supply voltage is supplied and an external output terminal on the basis of an output signal of the second inverter;
controlling a current flowing in a first NMOS transistor provided between the external output terminal and a reference voltage terminal on the basis of an output signal of the first inverter; and
turning temporarily on a second PMOS transistor that is provided between the power supply voltage terminal to which the second power supply voltage is supplied and a gate of the first PMOS transistor based on a second input signal supplied from a gate of the second PMOS transistor,
wherein the second input signal is generated by a signal generation circuit in synchronization with falling of the first input signal.

* * * * *